United States Patent
Lee et al.

(10) Patent No.: US 10,332,890 B2
(45) Date of Patent: Jun. 25, 2019

(54) SEMICONDUCTOR MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: Kiseok Lee, Hwaseong-si (KR); Chan-Sic Yoon, Anyang-si (KR); Augustin Hong, Seoul (KR); Keunnam Kim, Yongin-si (KR); Dongoh Kim, Daegu (KR); Bong-Soo Kim, Yongin-si (KR); Jemin Park, Suwon-si (KR); Hoin Lee, Suwon-si (KR); Sungho Jang, Seoul (KR); Kiwook Jung, Seoul (KR); Yoosang Hwang, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/653,198

(22) Filed: Jul. 18, 2017

(65) Prior Publication Data
US 2018/0158871 A1    Jun. 7, 2018

(30) Foreign Application Priority Data
Dec. 2, 2016    (KR) .................. 10-2016-0163757

(51) Int. Cl.
*H01L 27/108*    (2006.01)
*H01L 27/24*    (2006.01)
*H01L 27/22*    (2006.01)

(52) U.S. Cl.
CPC .. *H01L 27/10894* (2013.01); *H01L 27/10823* (2013.01); *H01L 27/10844* (2013.01);
(Continued)

(58) Field of Classification Search
CPC ......... H01L 27/10894; H01L 27/10897; H01L 27/11286; H01L 27/11293; H01L 27/11573; H01L 29/7848
See application file for complete search history.

(56) References Cited

U.S. PATENT DOCUMENTS 5,467,308 A * 11/1995 Chang ................ G11C 16/0491
                                                       257/314
6,034,416 A *  3/2000 Uehara ............. H01L 27/11526
                                                       257/296
(Continued)

FOREIGN PATENT DOCUMENTS

JP    2014-011443 A    1/2014
KR    10-2014-0110146 A    9/2014
(Continued)

*Primary Examiner* — Eric A. Ward
(74) *Attorney, Agent, or Firm* — Lee & Morse, P.C.

(57) ABSTRACT

A method of manufacturing a semiconductor memory device and a semiconductor memory device, the method including providing a substrate that includes a cell array region and a peripheral circuit region; forming a mask pattern that covers the cell array region and exposes the peripheral circuit region; growing a semiconductor layer on the peripheral circuit region exposed by the mask pattern such that the semiconductor layer has a different lattice constant from the substrate; forming a buffer layer that covers the cell array region and exposes the semiconductor layer; forming a conductive layer that covers the buffer layer and the semiconductor layer; and patterning the conductive layer to form conductive lines on the cell array region and to form a gate electrode on the peripheral circuit region.

19 Claims, 26 Drawing Sheets

(52) U.S. Cl.
CPC .. *H01L 27/10876* (2013.01); *H01L 27/10897* (2013.01); *H01L 27/2436* (2013.01); *H01L 27/228* (2013.01)

(56) References Cited

U.S. PATENT DOCUMENTS

| | | | |
|---|---|---|---|
| 8,361,858 B2 * | 1/2013 | Kronholz | H01L 21/823462 257/24 |
| 8,653,603 B2 | 2/2014 | Park et al. | |
| 9,112,029 B2 | 8/2015 | Boyanov et al. | |
| 9,305,928 B2 | 4/2016 | Kim et al. | |
| 9,390,982 B2 | 7/2016 | Ko et al. | |
| 2004/0102039 A1 * | 5/2004 | Lim | H01L 21/76877 438/674 |
| 2012/0086084 A1 | 4/2012 | Kikuchi | |
| 2014/0246729 A1 | 9/2014 | Jang et al. | |
| 2015/0123238 A1 | 5/2015 | Jang et al. | |
| 2015/0303201 A1 | 10/2015 | Lee et al. | |
| 2016/0163708 A1 | 6/2016 | Jang et al. | |

FOREIGN PATENT DOCUMENTS

| | | |
|---|---|---|
| KR | 10-2015-0051513 A | 5/2015 |
| KR | 10-2015-0088634 A | 8/2015 |
| KR | 10-2015-0121767 A | 10/2015 |
| KR | 10-2016-0067618 A | 6/2016 |

* cited by examiner

SEMICONDUCTOR MEMORY DEVICE AND METHOD OF MANUFACTURING THE SAME

CROSS-REFERENCE TO RELATED APPLICATION

Korean Patent Application No. 10-2016-0163757, filed on Dec. 2, 2016, in the Korean Intellectual Property Office, and entitled: "Semiconductor Memory Device and Method of Manufacturing the Same," is incorporated by reference herein in its entirety.

BACKGROUND

1. Field

Embodiments relate to a semiconductor memory device and a method of manufacturing the same.

2. Description of the Related Art

Semiconductor devices are widely used in an electronic industry because of their small sizes, multi-functional characteristics, and/or low manufacture costs. Semiconductor devices have been highly integrated with the development of the electronic industry. Widths of patterns included in semiconductor devices have been reduced to help increase the integration density of semiconductor devices.

SUMMARY

The embodiments may be realized by providing a method of manufacturing a semiconductor memory device, the method including providing a substrate that includes a cell array region and a peripheral circuit region; forming a mask pattern that covers the cell array region and exposes the peripheral circuit region; growing a semiconductor layer on the peripheral circuit region exposed by the mask pattern such that the semiconductor layer has a different lattice constant from the substrate; forming a buffer layer that covers the cell array region and exposes the semiconductor layer; forming a conductive layer that covers the buffer layer and the semiconductor layer; and patterning the conductive layer to form conductive lines on the cell array region and to form a gate electrode on the peripheral circuit region.

The embodiments may be realized by providing a semiconductor memory device including a substrate that includes active regions defined by a device isolation layer; word line structures filling trenches formed in an upper portion of the substrate, the word line structures intersecting the active regions to divide the active regions into first dopant regions and second dopant regions; bit lines intersecting the word line structures, the bit lines being connected to the first dopant regions; and data storage parts connected to the second dopant regions, wherein each of the word line structures includes a word line, a capping pattern, and a remaining pattern, which are sequentially stacked in each of the trenches.

The embodiments may be realized by providing a method of manufacturing a semiconductor memory device, the method including providing a substrate such that the substrate includes a cell array region and a peripheral circuit region such that the substrate includes a trench in the cell array region; forming a capping pattern in the trench such that the capping pattern extends to an opening of the trench; removing a portion of the capping pattern at the opening of the trench such that a recess region is formed at the opening of the trench; forming a mask pattern that covers the cell array region and exposes the peripheral circuit region such that the mask pattern is in the recess region at the opening of the trench; growing a semiconductor layer on the peripheral circuit region such that the semiconductor layer has a different lattice constant from the substrate; removing portions of the mask pattern such that a remaining pattern of the mask pattern remains in the trench adjacent to the opening of the trench; forming a buffer layer that covers the cell array region and exposes the semiconductor layer; forming conductive lines on the cell array region and a gate electrode on the peripheral circuit region.

BRIEF DESCRIPTION OF THE DRAWINGS

Features will be apparent to those of skill in the art by describing in detail exemplary embodiments with reference to the attached drawings in which:

FIGS. 3A to 11A illustrate cross-sectional views taken along a line A-A' of FIG. 2 to show stages in a method of manufacturing a semiconductor memory device, according to some embodiments.

FIGS. 3B to 11B illustrate cross-sectional views taken along lines B-B' and C-C' of FIG. 1 to show stages in a method of manufacturing a semiconductor memory device, according to some embodiments.

FIGS. 3C to 11C illustrate cross-sectional views taken along lines D-D' and E-E' of FIG. 1 to show stages in a method of manufacturing a semiconductor memory device, according to some embodiments.

DETAILED DESCRIPTION

Figure 1:
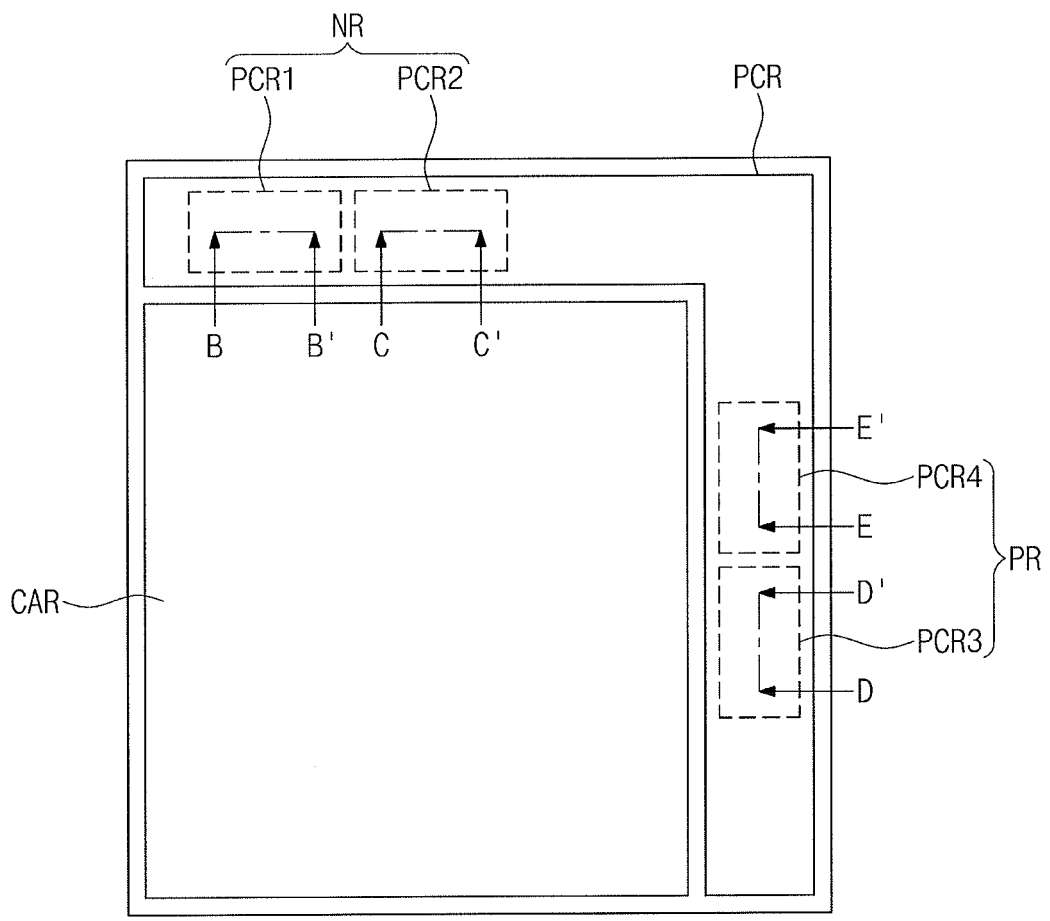
FIG. 1 illustrates a plan view of a semiconductor memory device according to some embodiments.
Figure 2:
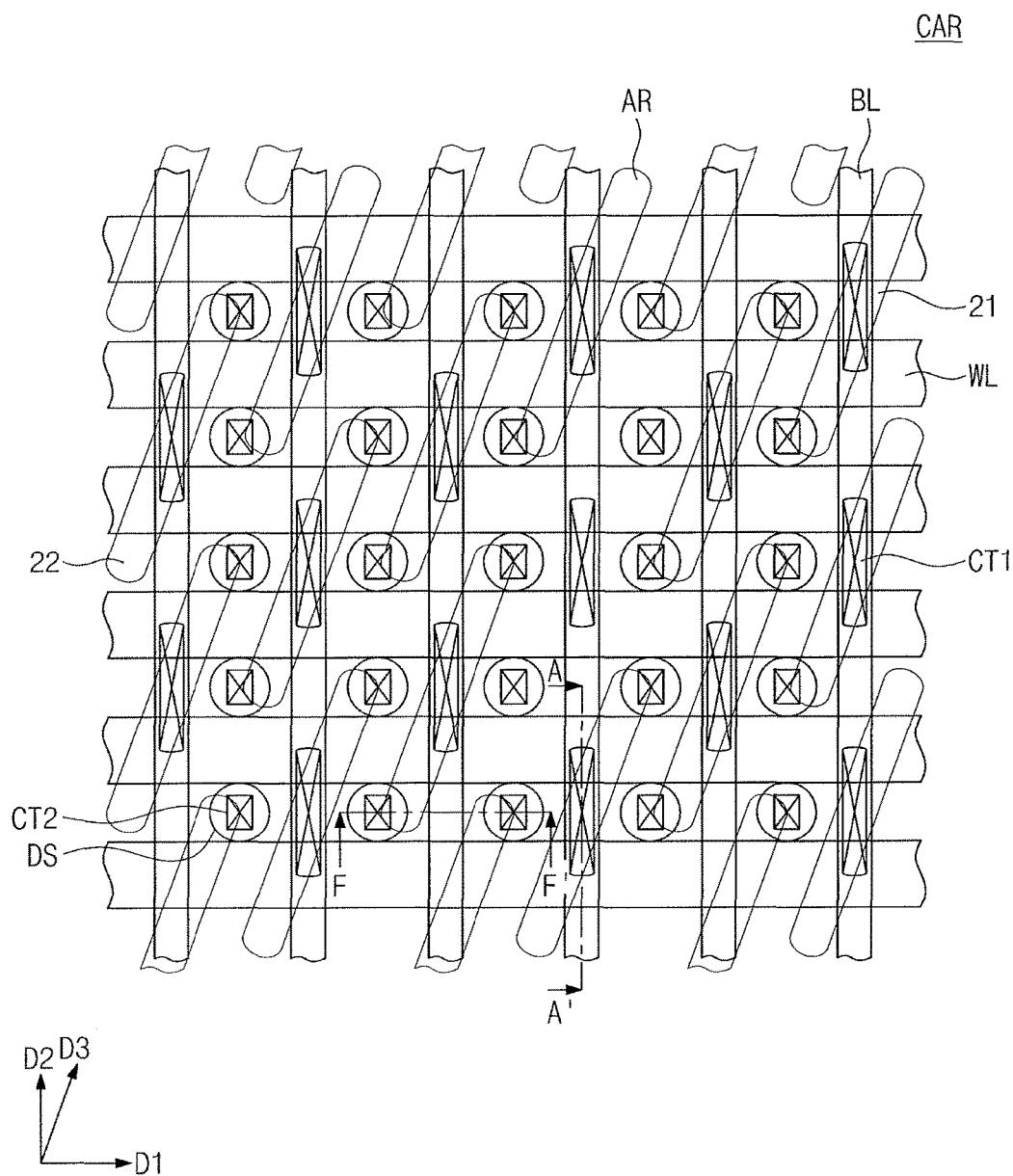
FIG. 2 illustrates an enlarged view of a cell array region illustrated in FIG. 1.
Figure 3A:
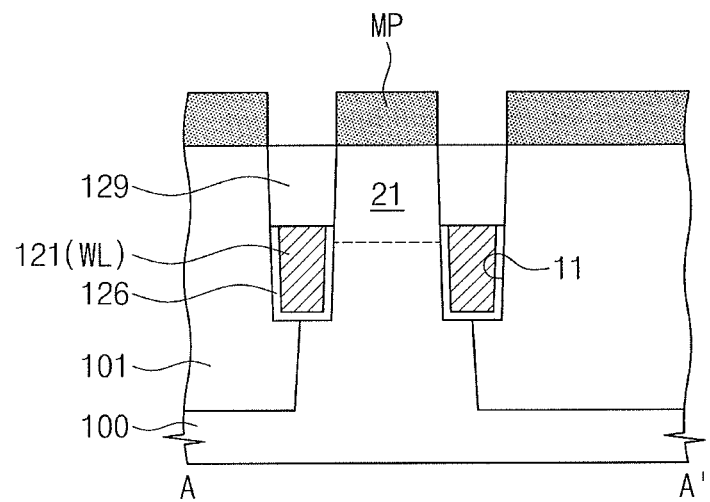
Figure 3B:
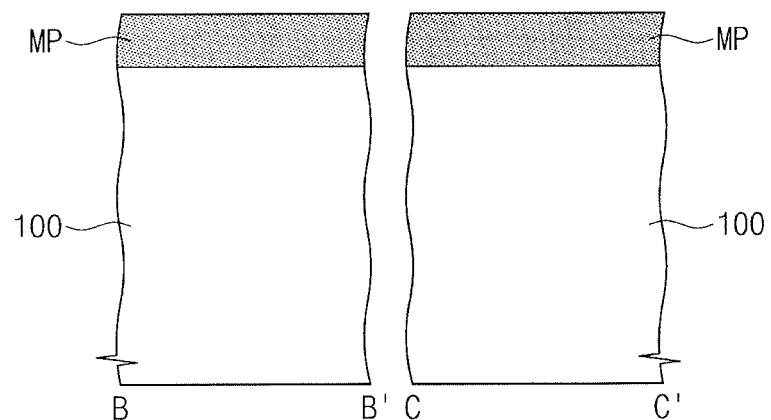
Figure 3C:
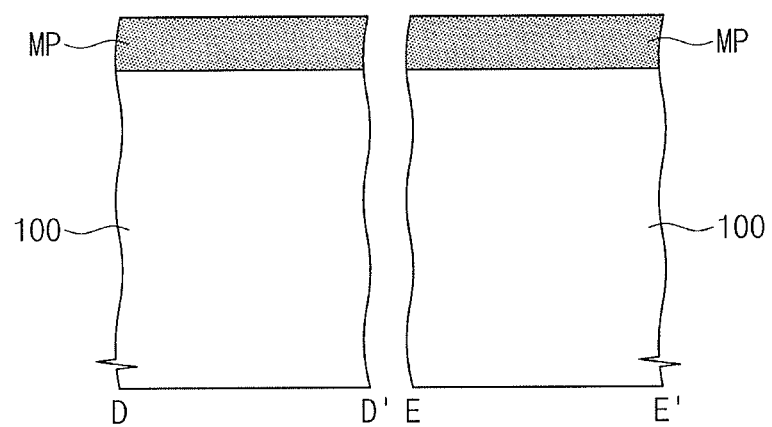
Figure 4A:
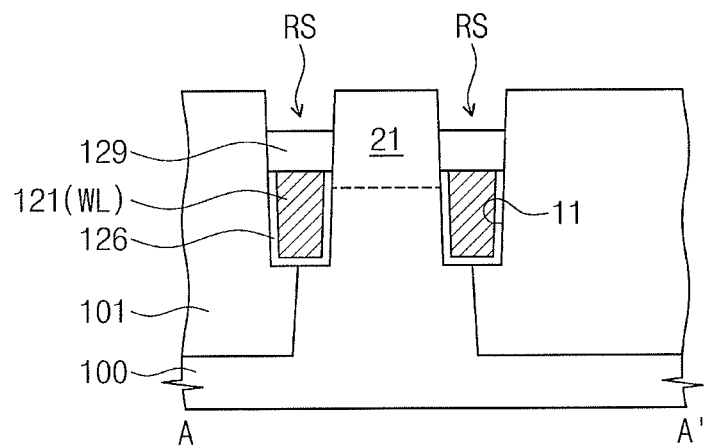
Figure 4B:
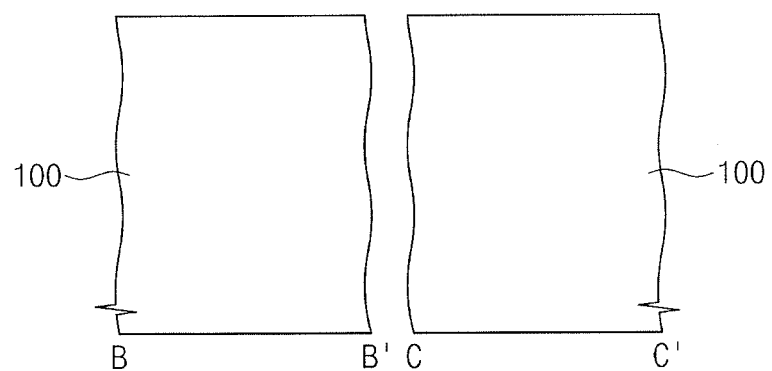
Figure 4C:
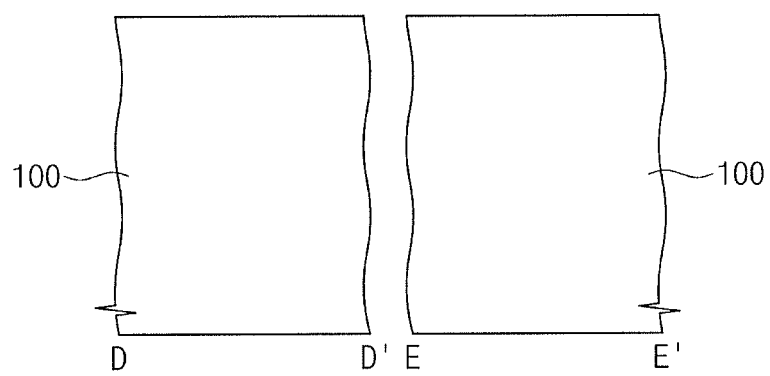
Figure 5A:
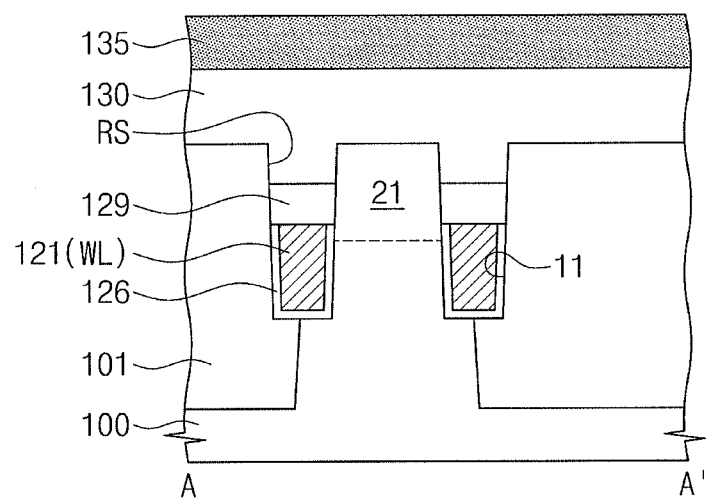
Figure 5B:
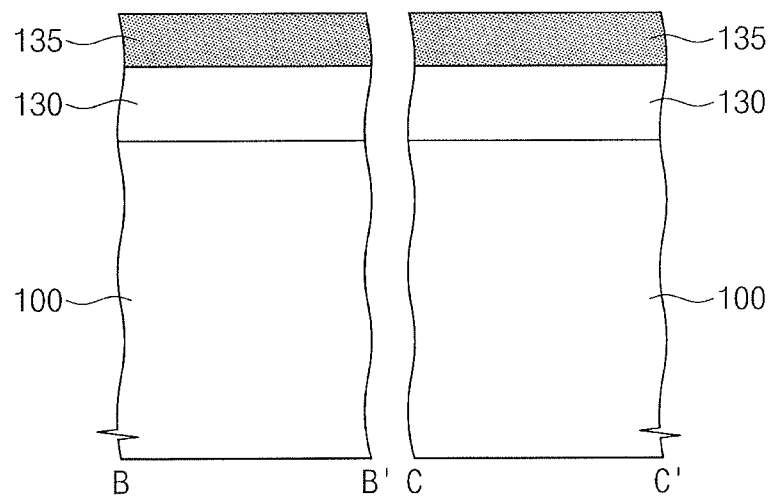
Figure 5C:
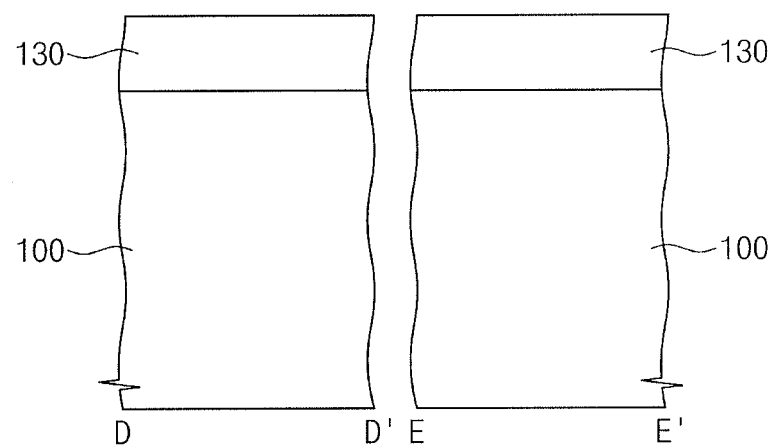
Figure 6A:
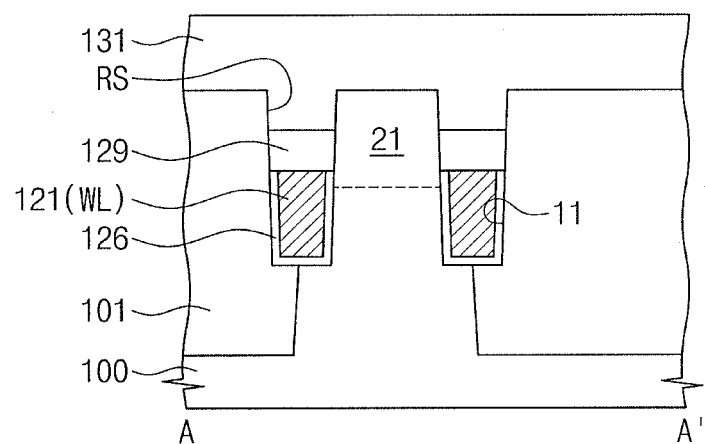
Figure 6B:
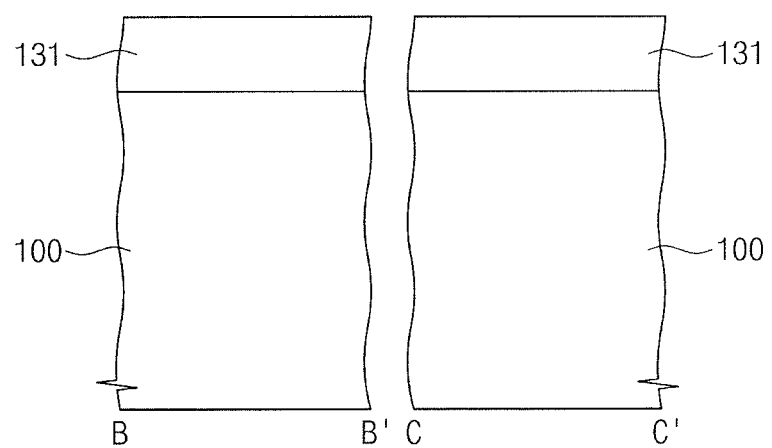
Figure 6C:
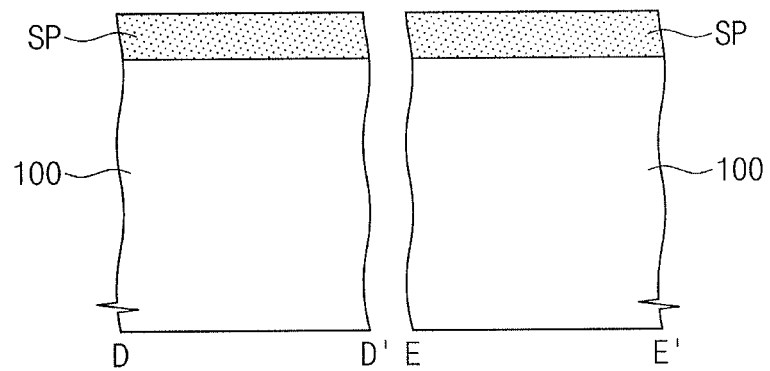
Figure 7A:
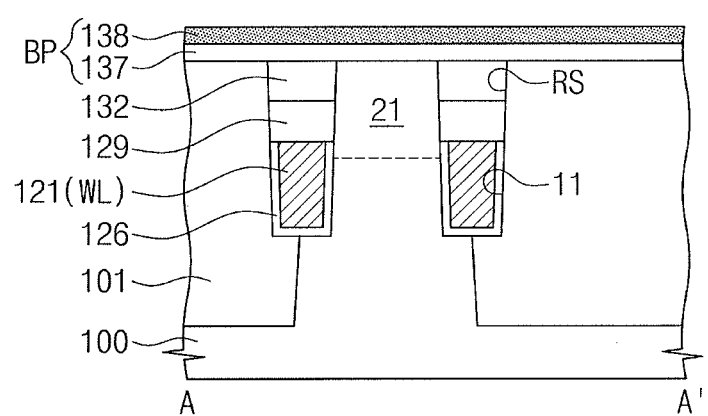
Figure 7B:
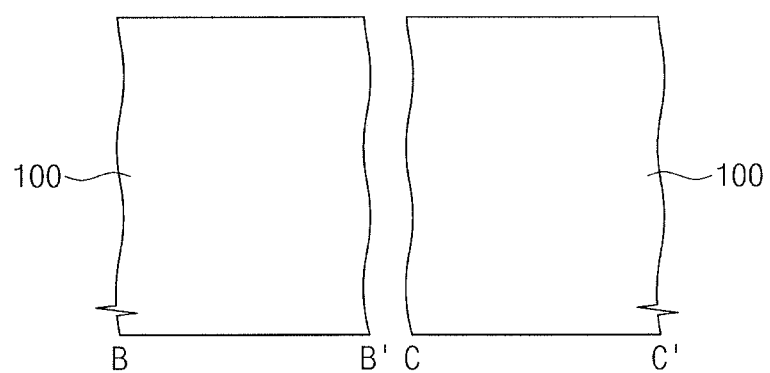
Figure 7C:
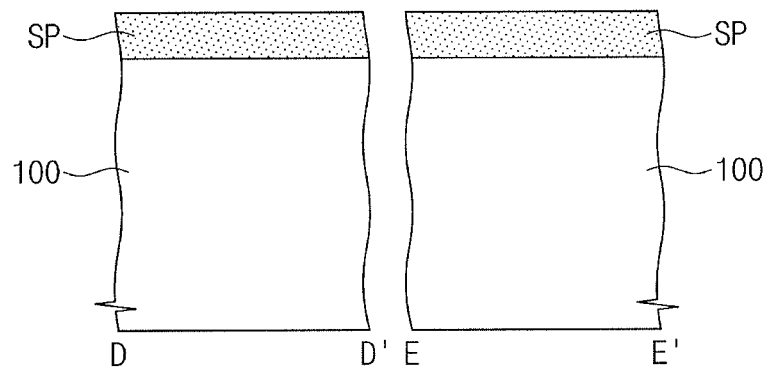
Figure 8A:
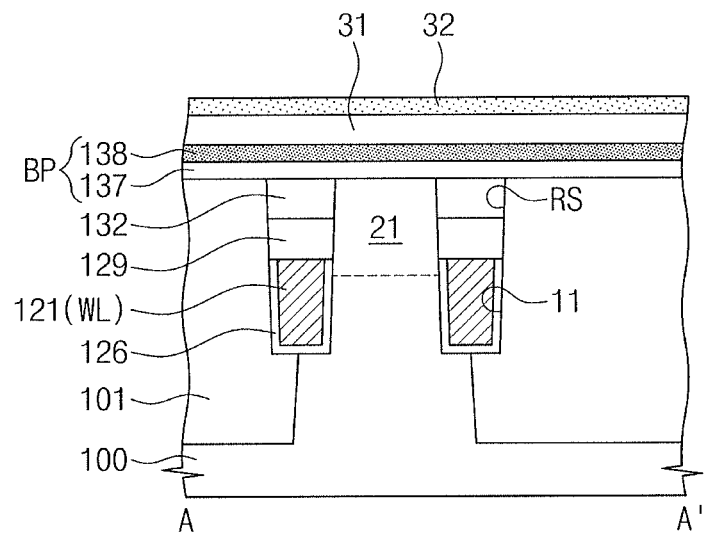
Figure 8B:
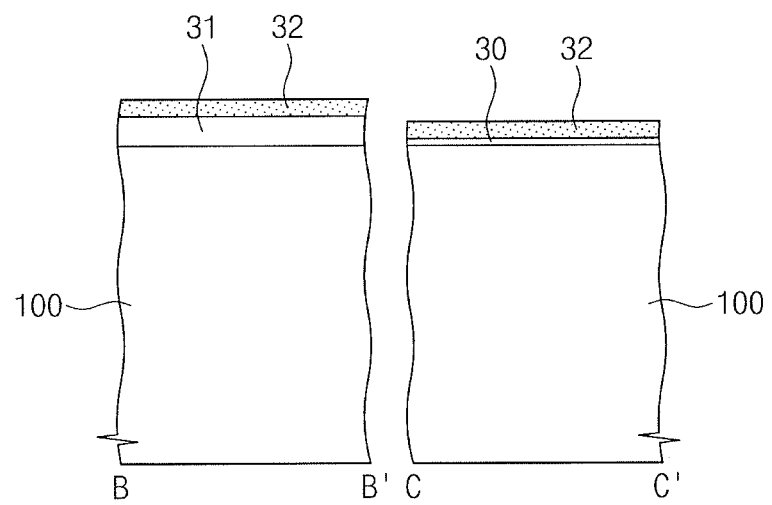
Figure 8C:
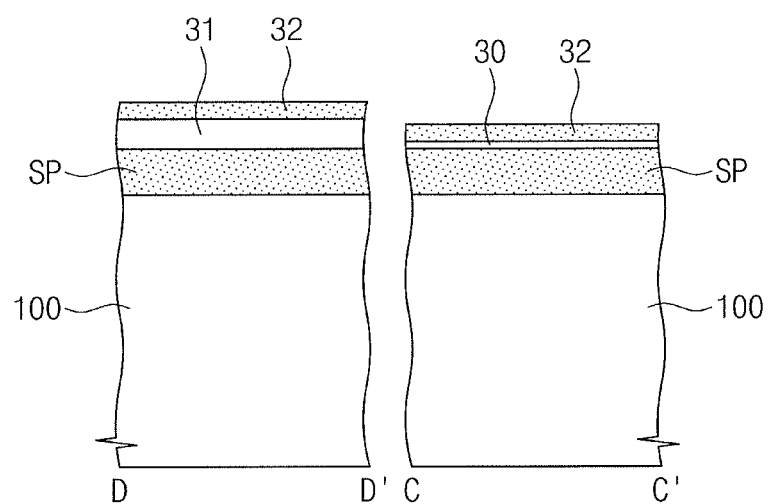
Figure 9A:
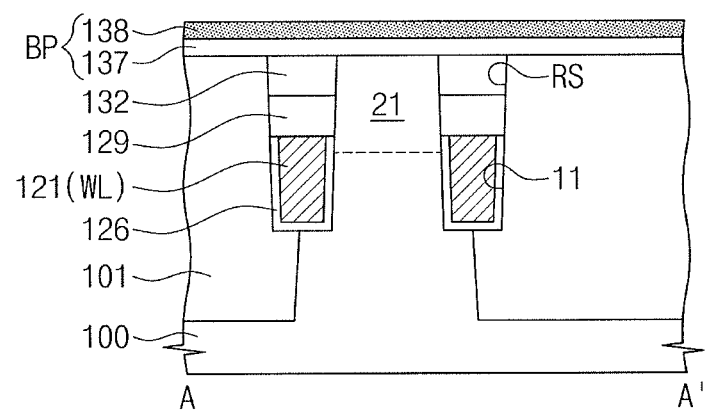
Figure 9B:
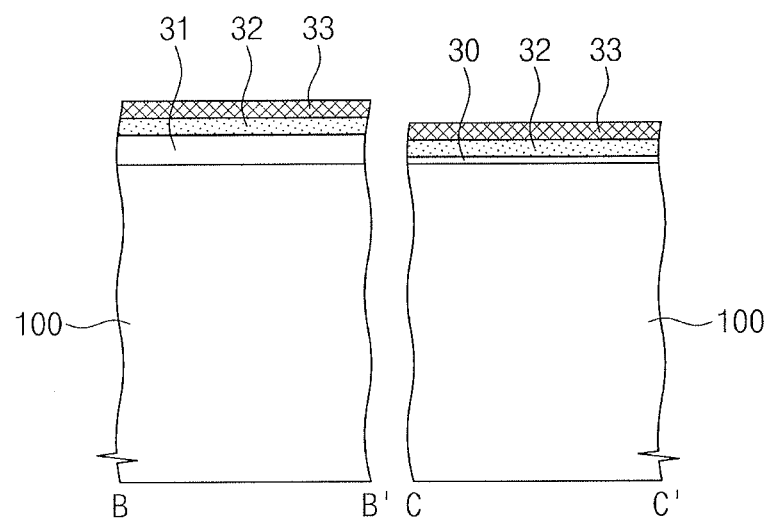
Figure 9C:
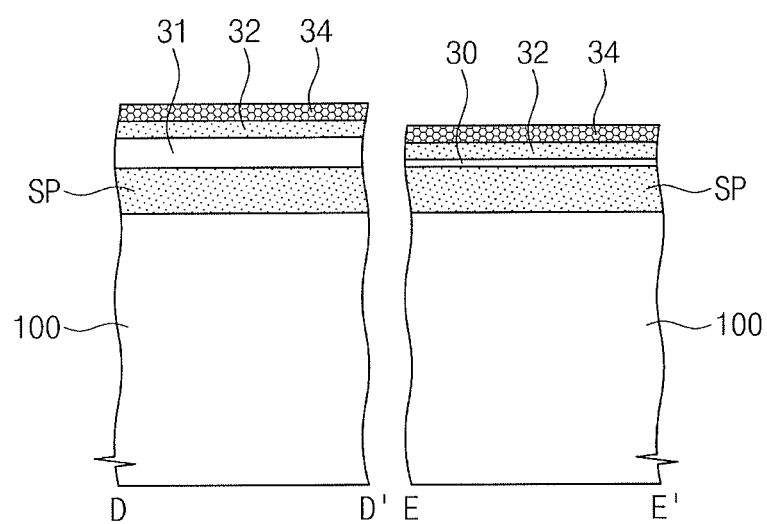
Figure 10A:
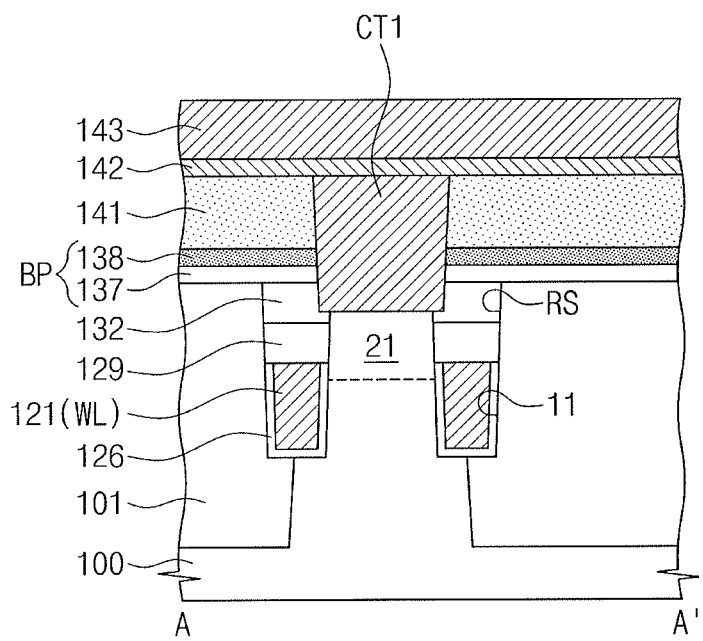
Figure 10B:
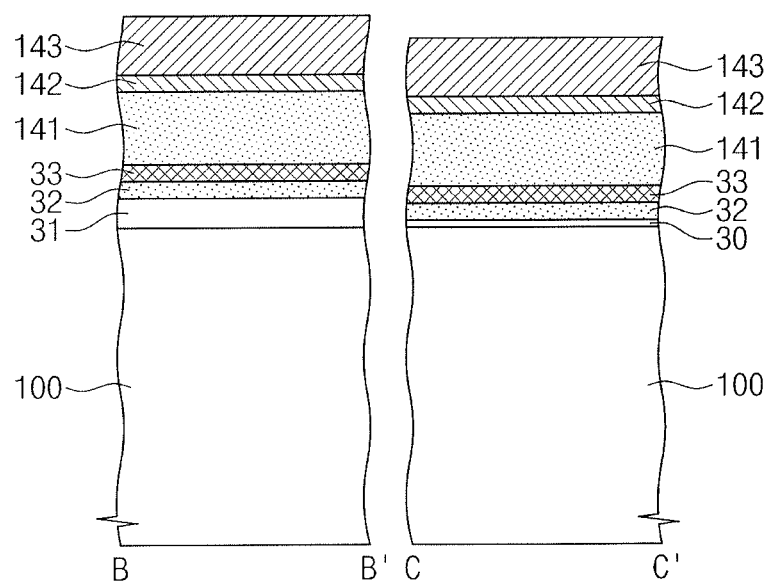
Figure 10C:
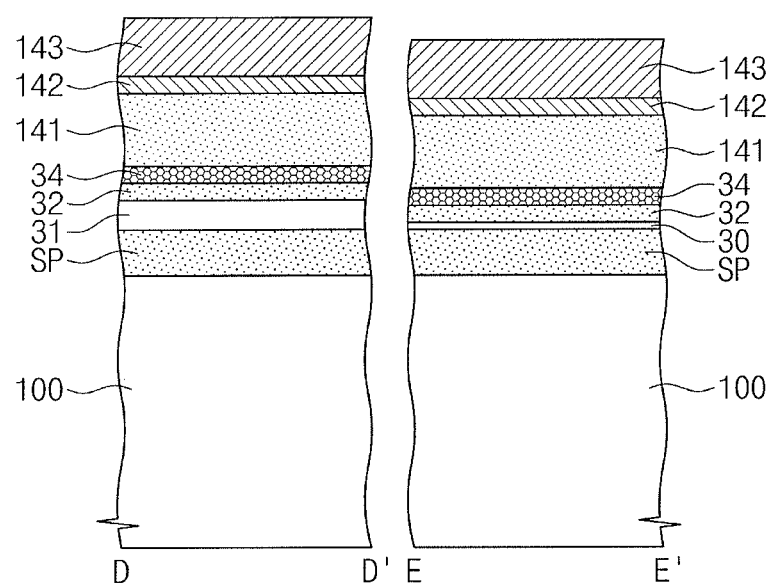

FIG. 1 illustrates a plan view of a semiconductor memory device according to some embodiments. FIG. 2 illustrates an enlarged view of a cell array region CAR illustrated in FIG. 1. FIGS. 3A to 11A, 3B to 11B, and 3C to 11C illustrate cross-sectional views taken along a line A-A' of FIG. 2 and B-B', C-C', D-D', and E-E' of FIG. 1 to show stages in a method of manufacturing a semiconductor memory device, according to some embodiments. FIG. 11D illustrates a cross-sectional view taken along a line F-F' of FIG. 2.

Referring to FIGS. 1, 2, and 3A to 3C, a substrate 100 including a cell array region CAR and a peripheral circuit region PCR may be provided. The cell array region CAR may be a region on which memory cells are disposed. The peripheral circuit region PCR may be a region on which, e.g., a word line driver, a sense amplifier, row and column decoders, and control circuits are disposed. The peripheral circuit region PCR may include an NMOSFET region NR and a PMOSFET region PR. The NMOSFET region NR may include a first region PCR1 and a second region PCR2. The PMOSFET region PR may include a third region PCR3 and a fourth region PCR4. The first and third regions PCR1 and PCR3 may be regions on which high-voltage transistors are formed. The second and fourth regions PCR2 and PCR4 may be regions on which low-voltage transistors are formed.

Device isolation layers 101 may be formed in the substrate 100 to define active regions AR in the cell array region CAR. In an implementation, the substrate 100 may be a silicon substrate. The active regions AR may have bar shapes laterally separated from each other, and each of the active regions AR may extend in a third direction (hereinafter, referred to as 'a D3 direction') non-perpendicular to a first direction (hereinafter, referred to as 'a D1 direction') and a second direction (hereinafter, referred to as 'a D2 direction'). The D2 direction and the D2 direction may intersect each other and may be parallel to a top surface of the substrate 100.

A dopant region (see 21 and 22 of FIGS. 2 and 11D) may be formed in an upper portion (e.g., one end or side) of each of the active regions AR. The dopant region may be formed by implanting dopant ions, which have a different conductivity type from the substrate 100, into an upper portion (e.g., one surface or side) of the substrate 100. In an implementation, a depth of the dopant region may be smaller than depths of the device isolation layers 101 (e.g., from the one surface or side of the substrate 100). The dopant region may be formed after or before the formation of the device isolation layers 101. In an implementation, the dopant region may be formed in a subsequent process rather than the present process. The dopant region may be confinedly formed in the cell array region CAR, e.g., only in the cell array region CAR. For example, the peripheral circuit region PCR may be covered with a mask layer when the dopant region is formed, and the dopant region may not be formed in the peripheral circuit region PCR.

Trenches 11 may be formed in an upper portion (e.g., the one surface or side) of the substrate 100 of the cell array region CAR. The trenches 11 may extend in the D1 direction and may be spaced apart from each other in the D2 direction, and the dopant region may be divided into first and second dopant regions 21 and 22 by the trenches 11. For example, the first dopant region 21 may be between a pair of the second dopant regions 22 in one active region AR, and the first dopant region 21 and the second dopant regions 22 may be separated from each other by the trenches 11 in the one active region AR.

In an implementation, a first mask pattern MP may be formed on the top surface (e.g., the one surface or side) of the substrate 100, and the trenches 11 may be formed by dry and/or wet etching process using the first mask pattern MP as an etch mask. The first mask pattern MP may cover the peripheral circuit region PCR, and the etching process may not be performed on the peripheral circuit region PCR. In an implementation, the first mask pattern MP may include, e.g., at least one of a silicon oxide layer, a silicon nitride layer, or a silicon oxynitride layer. Depths of the trenches 11 may be smaller than the depths of the device isolation layers 101.

Cell gate insulating patterns 126, cell gate conductive patterns 121, and capping patterns 129 may be sequentially formed on the resultant structure having the trenches 11. In an implementation, the cell gate conductive patterns 121 may be word lines WL. In an implementation, a cell gate insulating layer and a cell gate conductive layer may be formed in the trenches 11, and then, the cell gate insulating layer and the cell gate conductive layer may be etched to form the cell gate insulating patterns 126 and the cell gate conductive patterns 121 in lower regions of the trenches 11. The capping patterns 129 may be formed on the cell gate conductive patterns 121. An insulating layer may fill residual regions or remaining portions of the trenches 11 (e.g., in which the cell gate conductive patterns 121 have already formed), and then, an etch-back process may be performed on the insulating layer to form the capping patterns 129 (e.g., filling an upper portion near an opening of the trench).

For example, the cell gate insulating patterns 126 may include at least one of a silicon oxide layer, a silicon nitride layer, or a silicon oxynitride layer. The cell gate conductive patterns 121 may include at least one of a doped semiconductor material, a conductive metal nitride, a metal, or a metal-semiconductor compound (e.g., a metal silicide). The capping pattern 129 may include at least one of a silicon nitride layer, a silicon oxide layer, or a silicon oxynitride layer. Each of the cell gate insulating patterns 126, the cell gate conductive patterns 121, and the capping patterns 129 may be formed using at least one of a chemical vapor deposition (CVD) process, a physical vapor deposition (PVD) process, or an atomic layer deposition (ALD) process.

Referring to FIGS. 1, 2, and 4A to 4C, the first mask pattern MP may be removed. The first mask pattern MP may be removed by a wet etching process. During the removal process of the first mask pattern MP, upper portions of the capping patterns 129 may also be etched to form recess regions RS on or overlying the cell gate conductive patterns 121. The recess regions RS may extend in the D1 direction along the trenches 11 and may be spaced apart from each other in the D2 direction. Depths of the recess regions RS may be about 10% to about 40% of the depth of the trench 11.

Referring to FIGS. 1, 2, and 5A to 5C, a mask layer 130 may be formed to cover an entire region of the substrate 100, and then, a photoresist pattern 135 may be formed to cover the cell array region CAR. The photoresist pattern 135 may cover a portion of the peripheral circuit region PCR. In an implementation, the photoresist pattern 135 may cover the NMOSFET region NR (e.g., the first and second regions PCR1 and PCR2) of the peripheral circuit region PCR and may expose the PMOSFET region PR (e.g., the third and fourth regions PCR3 and PCR4) of the peripheral circuit region PCR. The mask layer 130 may fill the recess regions RS. In an implementation, the mask layer 130 may include a silicon oxide layer. The mask layer 130 may completely fill the recess regions RS and may extend onto the top or upper surface of the substrate 100 between the recess regions RS.

Referring to FIGS. 1, 2, and 6A to 6C, the mask layer 130 may be patterned using the photoresist pattern 135 as an etch mask to form a second mask pattern 131. The second mask pattern 131 may cover the cell array region CAR and the NMOSFET region NR and may expose the PMOSFET region PR. During the patterning process, an upper portion of the PMOSFET region PR may also be etched and removed. As a result, a top or upper surface of the PMOSFET region PR may be lower than top or upper surfaces of the cell array region CAR and the NMOSFET region NR. In an implementation, the upper portion of the PMOSFET region PR may not be removed.

A semiconductor layer SP may be formed on the substrate 100 of the exposed PMOSFET region PR. The semiconductor layer SP may be formed by a selective epitaxial growth (SEG) process. The cell array region CAR and the NMOSFET region PR may be covered by the second mask pattern 131, and the semiconductor layer SP may not be formed thereon. The semiconductor layer SP may include a semiconductor material of which a carrier mobility is higher than that of silicon. For example, the semiconductor layer SP may be a silicon-germanium layer of which a lattice constant is different from that of the substrate 100. In an implementation, the semiconductor layer SP may have a thickness of about 80 Å to about 120 Å.

Referring to FIGS. 1, 2, and 7A to 7C, the second mask pattern 131 may be removed from the cell array region CAR and the NMOSFET region NR. Portions of the second mask pattern 131 may remain in the recess regions RS, and remaining patterns 132 may be formed in the recess regions RS. A buffer pattern BP may be formed to cover the cell array region CAR and to expose the peripheral circuit region PCR. A bottom (e.g., substrate-facing) surface of the buffer pattern BP may be in contact with a top or upper surface of the remaining pattern 132. In an implementation, the buffer pattern BP may include a first buffer pattern 137 and a second buffer pattern 138 on the first buffer pattern 137. The first buffer pattern 137 and the second buffer pattern 138 may be formed of different materials. For example, the first buffer pattern 137 may be a silicon oxide layer, and the second buffer pattern 138 may be a silicon nitride layer. In an implementation, a silicon oxide layer and a silicon nitride layer may be sequentially formed on an entire surface of the substrate 100, and a patterning process may be performed on the silicon nitride layer and the silicon oxide layer by using a photoresist pattern covering the cell array region CAR and exposing the peripheral circuit region PCR, thereby forming the buffer pattern BP. In an implementation, an additional silicon oxide layer may be provided between the second buffer pattern 138 and the photoresist pattern.

Referring to FIGS. 1, 2, and 8A to 8C, a first gate insulating layer 31 may be formed on the first and third regions PCR1 and PCR3 corresponding to the high-voltage transistor regions. Thereafter, a second gate insulating layer 32 may be formed on an entire surface of the substrate 100. In an implementation, before the formation of the second gate insulating layer 32, a third gate insulating layer 30 may be formed on the second and fourth regions PCR2 and PCR4 corresponding to the low-voltage transistor regions. The first and second gate insulating layers 31 and 32 may also be foamed on the cell array region CAR.

A dielectric constant of the first gate insulating layer 31 may be lower than dielectric constants of the second and third gate insulating layers 32 and 30. In an implementation, the first gate insulating layer 31 may include a silicon oxide layer and/or a silicon oxynitride layer. The first gate insulating layer 31 may be thicker than the second and third gate insulating layers 30 and 32. The second gate insulating layer 32 may be a high-k dielectric layer of which a dielectric constant is higher than that of a silicon oxide layer. The dielectric constant of the second gate insulating layer 32 may be higher than the dielectric constants of the first and third gate insulating layers 31 and 30. In an implementation, the second gate insulating layer 32 may include an oxide, nitride, silicide, oxynitride, or silicide-oxynitride that includes hafnium (Hf), aluminum (Al), zirconium (Zr), or lanthanum (La). Each of the first and second gate insulating layers 31 and 32 may be formed using an ALD process, a CVD process, or a PVD process. In an implementation, the third gate insulating layer 30 may include a silicon oxide layer or a silicon oxynitride layer. In an implementation, the third gate insulating layer 30 may be formed by a thermal oxidation and/or thermal nitrification process consuming the exposed substrate 100 or the exposed semiconductor layer SP.

Referring to FIGS. 1, 2, and 9A to 9C, a first work-function adjustment layer 33 may be formed on the NMOSFET region NR, and a second work-function adjustment layer 34 may be formed on the PMOSFET region PR. The first and second gate insulating layers 31 and 32 on the cell array region CAR may be removed. The first and second work-function adjustment layers 33 and 34 may help implement a desired threshold voltage and other performances of each of transistors. Each of the first and second work-function adjustment layers 33 and 34 may be a single-layered or multi-layered metal containing layer having a specific work-function.

In an implementation, the second work-function adjustment layer 34 may include TiN, TiN/TaN, $Al_2O_3$/TiN, Al/TiN, TiN/Al/TiN, TiN/TiON, Ta/TiN, or TaN/TiN. In an implementation, TiN of these materials may be replaced with TaN, TaCN, TiCN, CoN, or CoCN. The second work-function adjustment layer 34 may have a thickness of 30 Å to 60 Å. The first work-function adjustment layer 33 may include the same layer as the second work-function adjustment layer 34 and may further include layers including La/TiN, Mg/TiN, or Sr/TiN disposed on the same layer. In an implementation, La may be replaced with LaO or LaON.

Referring to FIGS. 1, 2, and 10A to 10C, a first conductive layer 141 may be formed on the cell array region CAR and the peripheral circuit region PCR. The first conductive layer 141 may include a doped semiconductor layer. In an implementation, the first conductive layer 141 may include a poly-silicon layer doped with P-type dopants. A first contact CT1 may be formed to penetrate the first conductive layer 141 and the buffer pattern BP. The first contact CT1 may be connected to the first dopant region 21. The first contact CT1 may include at least one of a doped semiconductor material, a conductive metal nitride, or a metal. After the formation of the first contact CT1, a barrier layer 142 and a second conductive layer 143 may be sequentially formed on the cell array region CAR and the peripheral circuit region PCR. The barrier layer 142 may include at least one of a conductive metal nitride, a metal-silicon compound, or a metal-silicon nitride. The second conductive layer 143 may include at least one of a metal, a conductive metal nitride, or a metal-silicon compound. In an implementation, the second conductive layer 143 may include at least one of tungsten (W), titanium (Ti), or tantalum (Ta). Each of the first conductive layer 141, the barrier layer 142, and the second conductive layer 143 may be formed using an ALD process or a PVD process.

Referring to FIGS. 1, 2, and 11A to 11D, a capping layer 151 may be formed, and then, a patterning process may be performed to form conductive lines on the cell array region CAR and to form first to fourth transistors TR1 to TR4 (e.g., gate patterns, including gate electrodes, of the first to fourth transistors TR1 to TR4) on the peripheral circuit region PCR. In an implementation, the conductive lines may be bit lines BL. The first conductive layer 141, the barrier layer 142, and the second conductive layer 143 may be formed into a first conductive pattern 145, a barrier pattern 146, and a second conductive pattern 147, respectively, by the patterning process. The patterning process may be performed using the buffer pattern BP as an etch stop layer. Thereafter, first source/drain regions 161 may be formed in the NMOSFET region NR, and second source/drain regions 162 may be formed in the PMOSFET region PR. In an implementation, the first source/drain regions 161 may be N-type dopant regions, and the second source/drain regions 162 may be P-type dopant regions. Spacers 152 may be formed on sidewalls of the bit lines BL and the first to fourth transistors TR1 to TR4. In an implementation, the spacers 152 may include silicon oxide.

Contact holes may be formed to expose the second dopant regions 22, and second contacts CT2 may fill the contact holes. The second contacts CT2 may include at least one of a metal, a conductive metal nitride, or a metal-silicon compound. In an implementation, each of the second contacts CT2 may include a poly-silicon pattern and a metal pattern that are sequentially stacked. Data storage structures or parts DS may be formed on the second contacts CT2. In an implementation, when the semiconductor memory device of the inventive concepts is a dynamic random access memory (DRAM) device, the data storage part DS may be a capacitor including a lower electrode, a dielectric layer, and an upper electrode. In an implementation, the data storage part DS may include a phase-change layer, a variable resistance layer, or a magnetic tunnel junction layer.

Figure 11A:
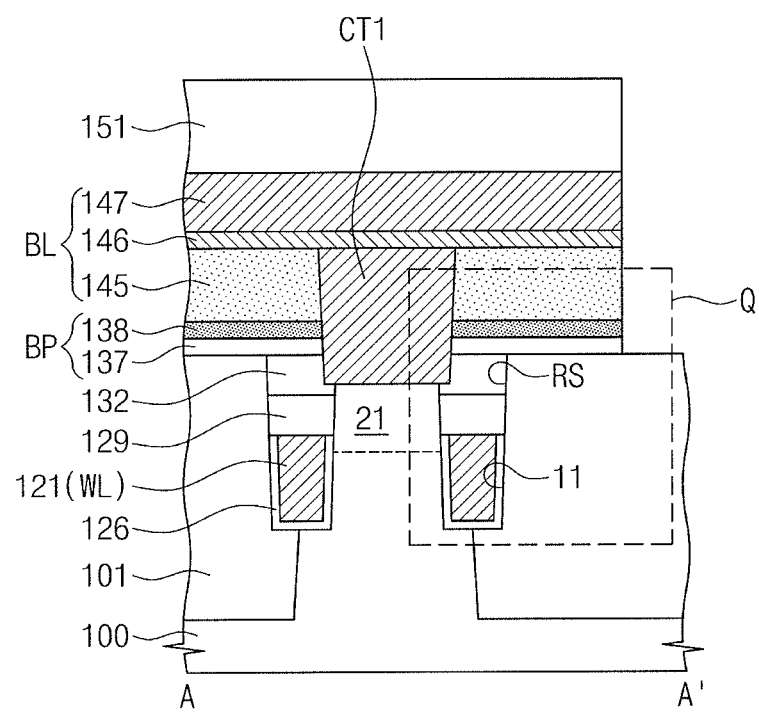
Figure 11B:
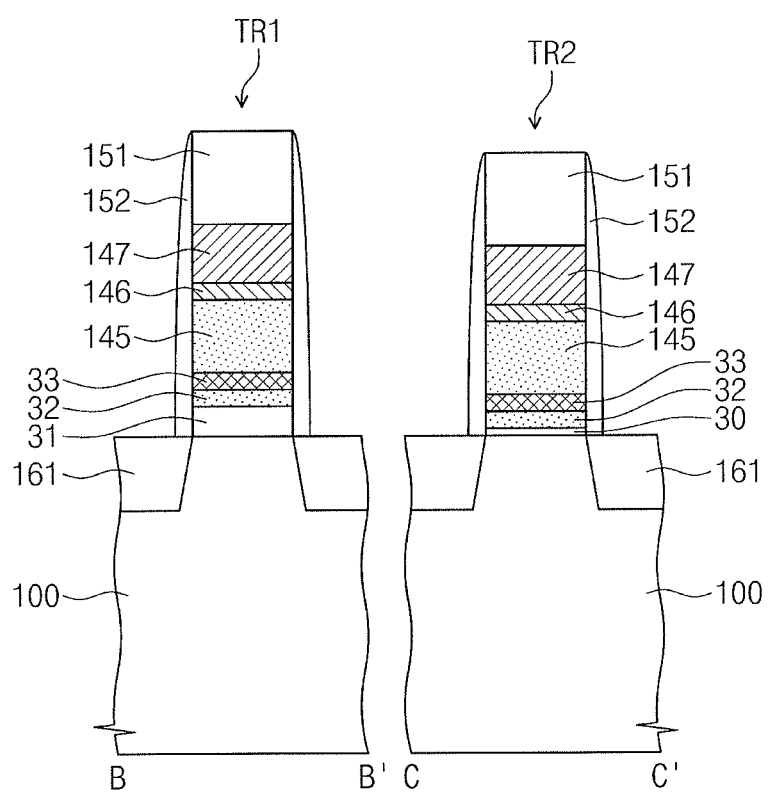
Figure 11C:
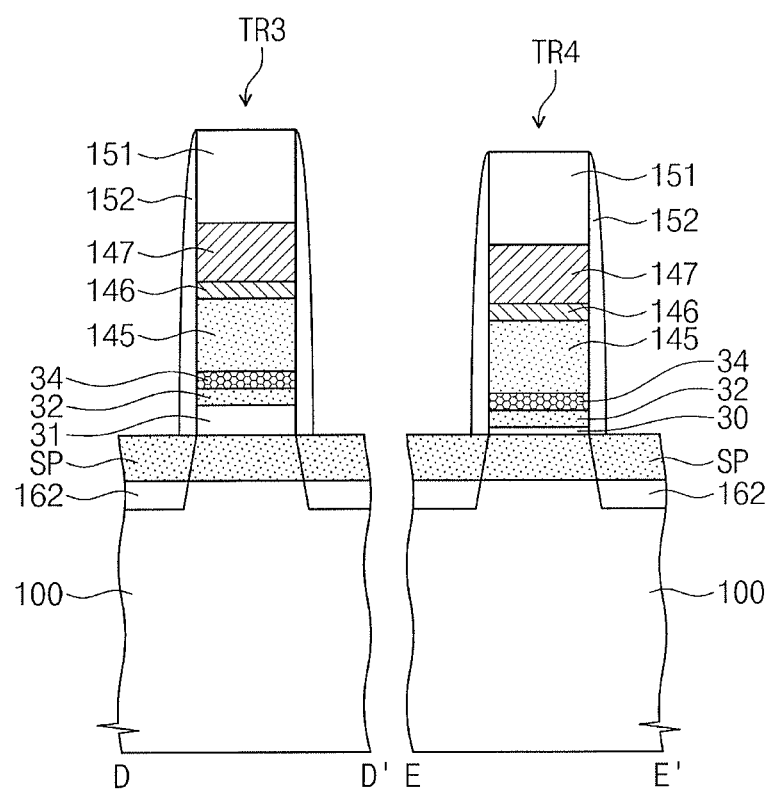
Figure 11D:
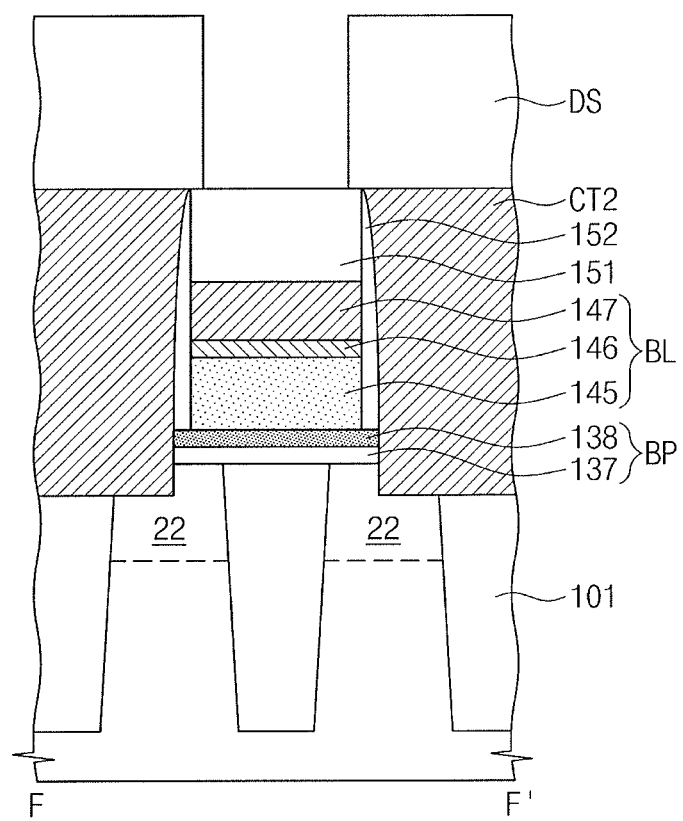
FIG. 11D illustrates a cross-sectional view taken along a line F-F' of FIG. 2.
Figure 12A:
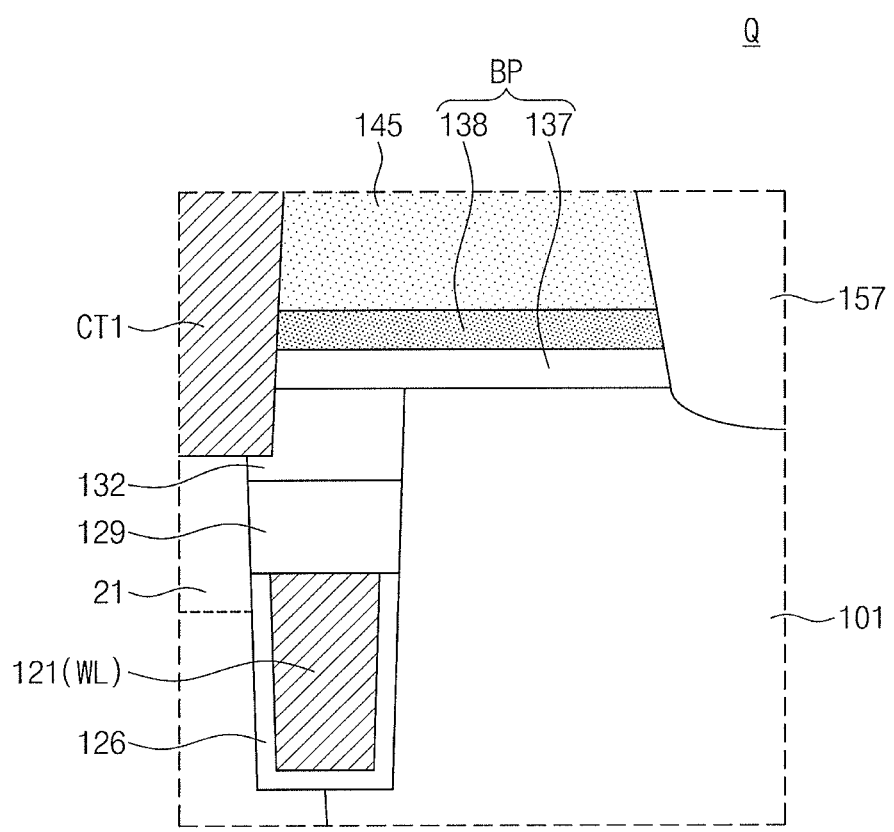
FIG. 12A illustrates an enlarged view of a region 'Q' of FIG. 11A according to some embodiments.
Figure 12B:
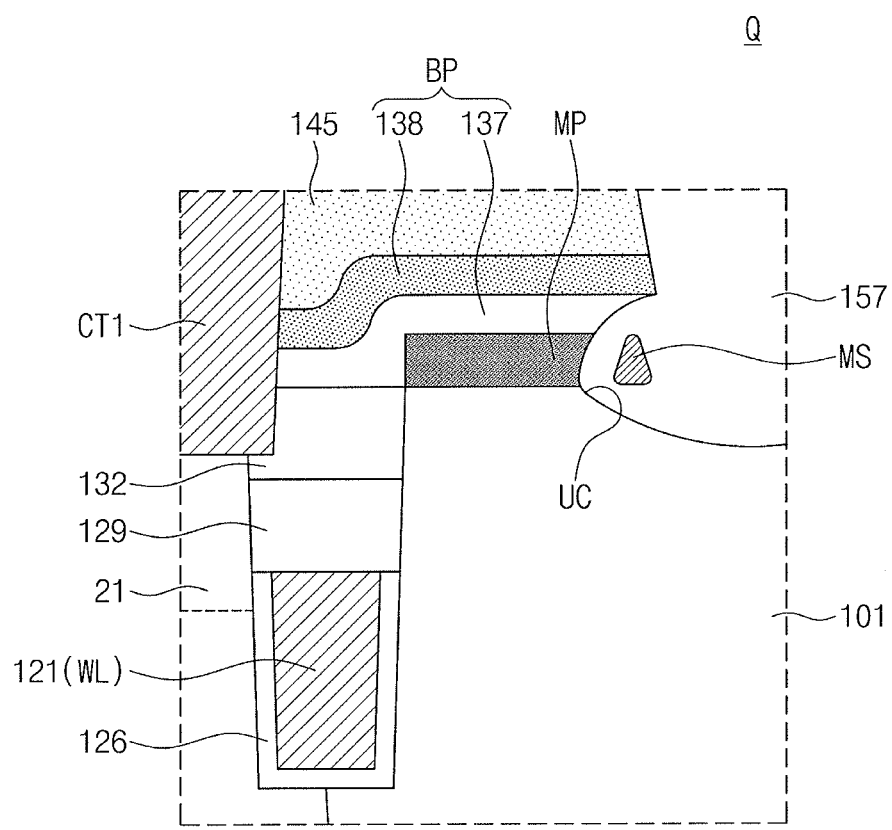
FIG. 12B illustrates an enlarged view of a comparative example corresponding to the region 'Q' of FIG. 11A.

FIG. 12A illustrates an enlarged view of a region 'Q' of FIG. 11A according to some embodiments, and FIG. 12B illustrates an enlarged view of a comparative example corresponding to the region 'Q' of FIG. 11A. The region 'Q' may correspond to a boundary region of the cell array region CAR and the peripheral circuit region PCR. End portions of the bit lines BL may be provided in the region 'Q'. The comparative example of FIG. 12B illustrates a resultant structure in which the buffer pattern BP is formed before the formation of the semiconductor layer SP. A portion of the first mask pattern MP may not be completely removed, as shown in the comparative example of FIG. 12B. Thus, sidewalls of the remaining parts first mask pattern MP and the first buffer pattern 137 disposed thereon may be excessively recessed in the patterning process described with reference to FIGS. 11A to 11D, and thus an undercut region UC may be formed. Therefore, a conductive residue MS may occur or result in an interlayer insulating layer 157 covering the undercut region UC. The conductive residue MS may occur by or during a deposition process of a conductive material for forming a contact or electrode formed after the formation of the undercut region UC. For example, the conductive residue MS may include a metal material such as La, Ti, Al, or Hf. The conductive residue MS may extend along a boundary of the cell array region CAR and the peripheral circuit region PCR, and thus an electrical short could be caused between interconnection lines of a semiconductor memory device.

Referring to FIG. 12A, according to some embodiments, the buffer pattern BP may be formed after the formation of the semiconductor layer SP. Thus, an undercut region and a conductive residue may not be present, as illustrated in FIG. 12A. To completely remove the remaining first mask pattern MP, the etching process may be performed until the recess regions RS are formed, as described with reference to FIGS. 4A to 4C. If the buffer pattern BP were to be formed before the formation of the semiconductor layer SP, like the comparative example, the recess regions RS may not be completely filled due to the buffer pattern BP having a relatively thin thickness. In an implementation, the semiconductor layer SP may be formed after the formation of the recess regions RS and before the formation of the buffer pattern BP. The recess regions RS may be filled with the portions of the second mask pattern 131 for forming the semiconductor layer SP, and the electrical short between interconnection lines of a semiconductor memory device of FIG. 12B may be avoided. Thus, reliability of the semiconductor memory device may be improved.

The semiconductor memory device according to some embodiments may include word line structures in the trenches 11 formed in the upper portion of the substrate 100, and each of the word line structures may include the word line WL, the capping pattern 129 and the remaining pattern 132, which are sequentially stacked in each of the trenches 11. The remaining pattern 132 may extend along the top surface of the word line WL. The word line structures may intersect the active regions AR to divide the active regions AR into the first dopant regions 21 and the second dopant regions 22. The bit lines BL may extend in the D2 direction and may be connected to the first dopant regions 21 through the first contacts CT1. The second dopant regions 22 may be connected to the data storage parts DS through the second contacts CT2. The buffer pattern BP may be provided between the substrate 100 and the bit lines BL, and the first contacts CT1 and the second contacts CT2 may penetrate the buffer pattern BP. The first contacts CT1 may penetrate the buffer pattern BP so as to be connected to the remaining pattern 132.

The semiconductor memory device according to some embodiments may include the first transistor TR1 and the second transistor TR2 on the NMOSFET region NR and may include the third transistor TR3 and the fourth transistor TR4 on the PMOSFET region PR. The third and fourth transistors TR3 and TR4 may use the semiconductor layer SP including the semiconductor material (e.g., silicon-germanium) having a high carrier mobility as channel regions. Each of the first and third transistors TR1 and TR3 corresponding to the high-voltage transistors may include the first gate insulating layer 31 and the second gate insulating layer 32, and each of the second and fourth transistors TR2 and TR4 corresponding to the low-voltage transistors may include the third gate insulating layer 30 and the second gate insulating layer 32. Each of the first and second transistors TR1 and TR2 may include the first work-function adjustment layer 33, and each of the third and fourth transistors TR3 and TR4 may include the second work-function adjustment layer 34. Each of the first to fourth transistors TR1 to TR4 may include the first conductive pattern 145, the barrier pattern 146, the second conductive pattern 147, and the capping layer 151.

Figure 13A:
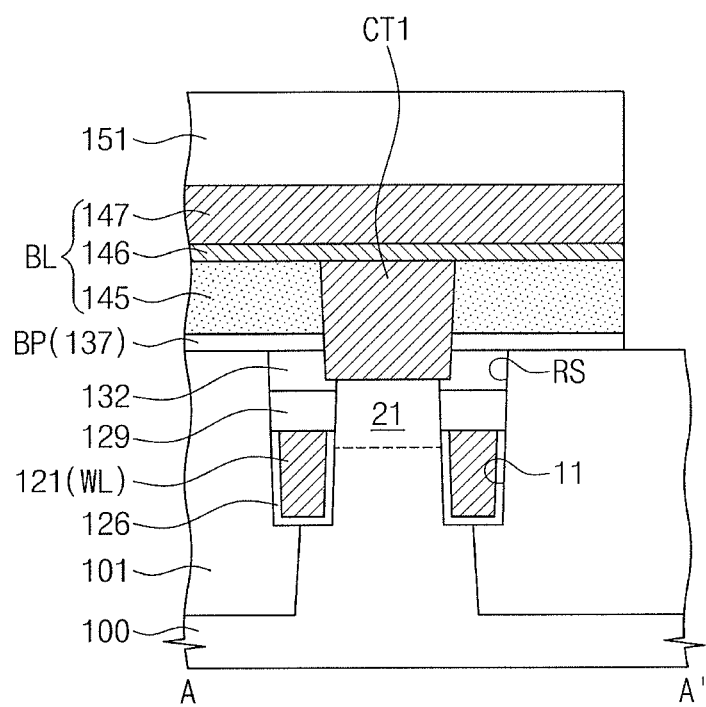
FIGS. 13A and 13B illustrate cross-sectional views taken along the lines A-A' and F-F' of FIG. 2 of a semiconductor memory device according to some embodiments.
Figure 13B:
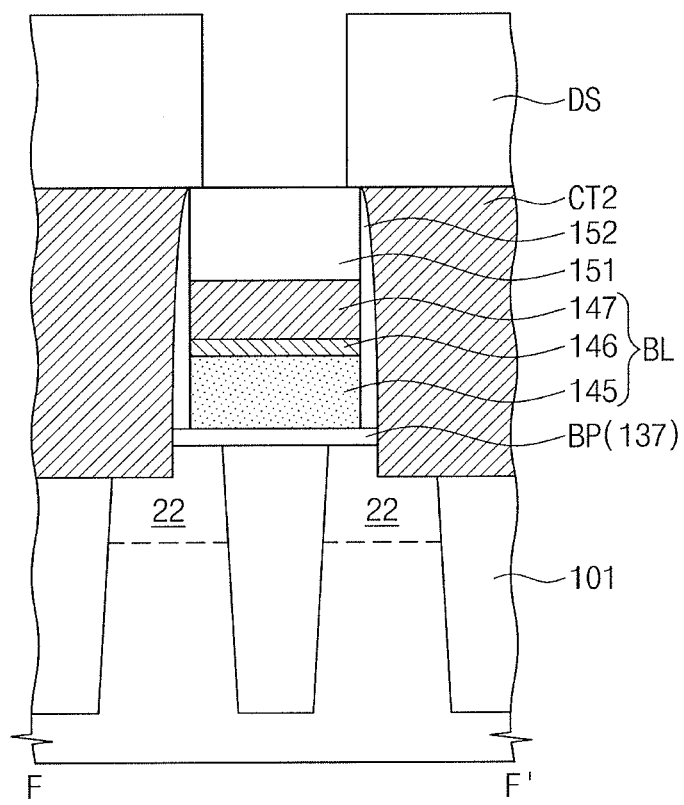

FIGS. 13A and 13B illustrate cross-sectional views taken along the lines A-A' and F-F' of FIG. 2 to show a semiconductor memory device according to some embodiments. Hereinafter, repeated descriptions to the same elements as in the above embodiments may be omitted for the purpose of ease and convenience in explanation.

Referring to FIGS. 13A and 13B, a buffer pattern BP may be a single layer of the first buffer pattern 137 without the second buffer pattern 138. For example, the first buffer patterns 137 may be a silicon oxide layer.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

By way of summation and review, new exposure techniques and/or expensive exposure techniques may be needed to form fine patterns, and it may be difficult to highly integrate semiconductor devices. Thus, new integration techniques are being considered.

According to some embodiments, it is possible to help prevent the conductive residue from being formed between the cell array region and the peripheral circuit region. Thus, the reliability of the semiconductor memory device may be improved.

The embodiments may provide a semiconductor memory device with improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor memory device, the method comprising:
    providing a substrate that includes a cell array region and a peripheral circuit region;
    forming a device isolation layer in the cell array region of the substrate to define active regions,
    forming word lines dividing each of the active regions into a first dopant region and a second dopant region,
    forming a mask pattern that covers the cell array region and exposes the peripheral circuit region;
    growing a semiconductor layer on the peripheral circuit region exposed by the mask pattern such that the semiconductor layer has a different lattice constant from the substrate;
    forming a buffer layer that covers the cell array region and exposes the semiconductor layer;
    forming a conductive layer that covers the buffer layer and the semiconductor layer; and
    patterning the conductive layer to form conductive lines on the cell array region and to form a gate electrode on the peripheral circuit region,
    wherein forming the device isolation layer in the cell array region of the substrate to define active regions is performed prior to forming the mask pattern.

2. The method as claimed in claim 1, wherein the buffer layer is formed after growing the semiconductor layer.

3. The method as claimed in claim 1, wherein patterning the conductive layer is performed using the buffer layer as an etch stop layer.

4. The method as claimed in claim 1, wherein the semiconductor layer includes silicon-germanium.

5. The method as claimed in claim 1, further comprising forming a gate insulating layer on the semiconductor layer after forming the buffer layer and prior to forming the conductive layer.

6. The method as claimed in claim 1, wherein:
    the peripheral circuit region includes a PMOSFET region and an NMOSFET region,
    the mask pattern covers the NMOSFET region, and
    the semiconductor layer is formed on the PMOSFET region.

7. The method as claimed in claim 1, wherein the buffer layer includes at least one of a silicon oxide layer, a silicon nitride layer, or a silicon oxynitride layer.

8. The method as claimed in claim 7, wherein the buffer layer includes the silicon oxide layer and the silicon nitride layer, the silicon nitride layer being on the silicon oxide layer.

9. The method as claimed in claim 1, wherein the buffer layer is thinner than the mask pattern.

10. The method as claimed in claim 1, wherein:
    forming the word lines includes:
    forming trenches in the substrate; and
    providing a conductive material in the trenches,
    wherein the mask pattern fills upper regions of the trenches.

11. The method as claimed in claim 10, wherein forming the trenches includes:
    forming a trench mask on the substrate;
    etching an upper portion of the substrate using the trench mask as an etch mask; and
    removing the trench mask.

12. The method as claimed in claim 11, further comprising forming capping patterns filling upper regions of the trenches after the forming of the word lines, wherein:
    upper portions of the capping patterns are removed during the removing of the trench mask to form recess regions in the trenches, and
    the mask pattern fills the recess regions.

13. The method as claimed in claim 1, further comprising forming first contacts that penetrate the buffer layer to connect the first dopant regions to the conductive lines.

14. The method as claimed in claim 13, wherein:
    the conductive layer includes a first conductive layer and a second conductive layer,
    the first conductive layer includes a semiconductor and the second conductive layer includes a metal,
    the first contacts are formed prior to forming the second conductive layer, and
    the first contacts penetrate the first conductive layer.

15. The method as claimed in claim 1, further comprising:
    forming second contacts that penetrate the buffer layer between the conductive lines such that the second contacts are connected to the second dopant regions; and
    forming data storage parts on the second contacts, respectively.

16. A method of manufacturing a semiconductor memory device, the method comprising:
    providing a substrate such that the substrate includes a cell array region and a peripheral circuit region such that the substrate includes a trench in the cell array region;
    forming a capping pattern in the trench such that the capping pattern extends to an opening of the trench;
    removing a portion of the capping pattern at the opening of the trench such that a recess region is formed at the opening of the trench;
    forming a mask pattern that covers the cell array region and exposes the peripheral circuit region such that the mask pattern is in the recess region at the opening of the trench;

growing a semiconductor layer on the peripheral circuit region such that the semiconductor layer has a different lattice constant from the substrate;

removing portions of the mask pattern such that a remaining pattern of the mask pattern remains in the trench adjacent to the opening of the trench;

forming a buffer layer that covers the cell array region and exposes the semiconductor layer;

forming conductive lines on the cell array region and a gate electrode on the peripheral circuit region.

17. The method as claimed in claim 16, further comprising forming a gate insulating layer on the semiconductor layer after forming the buffer layer and prior to forming the conductive lines.

18. The method as claimed in claim 16, wherein the buffer layer is thinner than the mask pattern.

19. The method as claimed in claim 16, further comprising:

forming a device isolation layer in the cell array region of the substrate to define active regions prior to the forming of the mask pattern; and forming word lines dividing each of the active regions into a first dopant region and a second dopant region.

\* \* \* \* \*